United States Patent [19]
Monk et al.

[11] Patent Number: 5,635,866
[45] Date of Patent: Jun. 3, 1997

[54] FREQUENCY DOUBLER

[75] Inventors: Trevor K. Monk, Chepstow, England; Andrew M. Hall, Edinburgh, Scotland

[73] Assignee: SGS-Thomson Microelectronics Limited, Bucks, United Kingdom

[21] Appl. No.: 360,696

[22] PCT Filed: Apr. 27, 1994

[86] PCT No.: PCT/GB94/00894

§ 371 Date: May 5, 1995

§ 102(e) Date: May 5, 1995

[87] PCT Pub. No.: WO94/26028

PCT Pub. Date: Nov. 10, 1994

[30] Foreign Application Priority Data

Apr. 30, 1993 [GB] United Kingdom ............ 9308944

[51] Int. Cl.⁶ .................................................. H03B 19/00
[52] U.S. Cl. ........................................ 327/116; 327/122
[58] Field of Search ............................. 327/116, 113, 327/114, 119, 122, 175, 355; 326/104

[56] References Cited

U.S. PATENT DOCUMENTS

| | | | |
|---|---|---|---|
| 3,350,659 | 10/1967 | Henn | 331/57 |
| 3,448,387 | 6/1969 | Brandt et al. | 327/116 |
| 4,368,480 | 1/1983 | Senturia | 357/25 |
| 4,737,732 | 4/1988 | Lippl | 327/122 |
| 5,475,322 | 12/1995 | MacDonald | 327/116 |

FOREIGN PATENT DOCUMENTS

| | | | |
|---|---|---|---|
| 0 187 572 | 7/1986 | European Pat. Off. | H03K 19/094 |
| 0 407 082 | 1/1991 | European Pat. Off. | G06F 1/04 |
| 6152338 | 5/1994 | Japan | 327/119 |
| WO94/01945 | 1/1994 | WIPO | H04J 3/00 |

OTHER PUBLICATIONS

Tietze and Schenk, *Halbleiter–Schaltungstechnik*, Springer-Verlag, Berlin, Heidelberg, New York, Tokyo, 1983, pp. 198–201 (In German).

Bennett et al., "Sub–Nanosecond Bipolar LSI," *1st I.E.E. European Solid State Circuits Conference, London*, GB, pp. 34–35, 1975.

*IBM Technical Disclosure Bulletin*, 32:(12), pp. 149–151, 1993.

Kumar, U. and S. P. Suri, "A simple digital 2 frequency multiplier," *Int. J. Electronics* 48:(1), pp. 43–45, 1980.

McGahee, T., "Pulse–frequency doubler requires no adjustment," *Electronics* 48:(8), p. 149, 1975.

Ware, et al., "THPM 14.1: A 200 MHZ CMOS Phase–Locked Loop With Dual Phase Detectors," *IEEE International Solid–State Circuits Conference*, New York, USA, pp. 192–193 and 338, 1989.

*Primary Examiner*—Toan Tran
*Attorney, Agent, or Firm*—David V. Carlson; Bryan A. Santarelli; Seed and Berry LLP

[57] ABSTRACT

A frequency doubler is described which is capable of receiving four input signals in quadrature and combining them to produce a pair of antiphase output signals at twice the input frequency.

6 Claims, 3 Drawing Sheets

FREQUENCY DOUBLER

FIELD OF THE INVENTION

The present invention relates to a frequency doubler which is capable of receiving four input signals in quadrature and combining them to produce a pair of antiphase output signals at twice the input frequency.

SUMMARY OF THE INVENTION

According to the present invention there is provided a frequency doubler circuit for receiving first to fourth input signals in quadrature and comprising: a first set of logic gates having inputs for receiving the input signals and providing outputs therefrom; and a second set of logic gates which have as their inputs only the outputs from the first set of logic gates and which supply as their outputs two signals in antiphase at twice the frequency of the input signals.

In the described embodiment the first set of logic gates comprises a first logic gate connected to receive the first and second input signals, a second logic gate connected to receive the second and third input signals, a third logic gate connected to receive the third and fourth input signals and a fourth logic gate connected to receive the first and fourth input signals, the signals supplied to each logic gate being 90° apart in phase and having a duty cycle close to 50%. The second set of logic gates comprises a fifth logic gate connected to receive the outputs of the first and third logic gates and a sixth logic gate connected to receive the outputs of the second and fourth logic gate.

The logic gates are preferably NAND gates, but it is also possible to use NOR gates. However, the switching frequency of the logic gate will limit the maximum operating frequency of the circuit. NAND gates are preferred because they have faster switching speed than NOR gates.

The frequency doubler confers a particular advantage when used to double the frequency of quadrature outputs of a quadrature oscillator, which outputs are subject to buffering and conversion. It is usually difficult to make the oscillator, buffer and convertor operate fast enough but with the present frequency doubler they need operate only at a relatively low frequency. The frequency doubler is then the only circuit which is required to run at a high frequency. This is easier to achieve because it can be designed in high speed CMOS logic and could probably have the facility to be powered by a full supply voltage, whereas the oscillator may be restricted to operate at low supply voltages (of less than 3 V ). An oscillator with which the present invention has particular advantage is described in our copending Application entitled "Quadrature Oscillator," by Trevor Kenneth Monk and Andrew Mendlicott Hall having a PCT Application No. of PCT/GB 94/00892 and a filing date of Apr. 27, 1994, the contents of which are herein incorporated by reference.

For a better understanding of the present invention, and to show how the same may be carried into effect reference will now be made by way of example to the accompanying drawings.

DESCRIPTION OF THE PREFERRED EMBODIMENT

Figure 1:
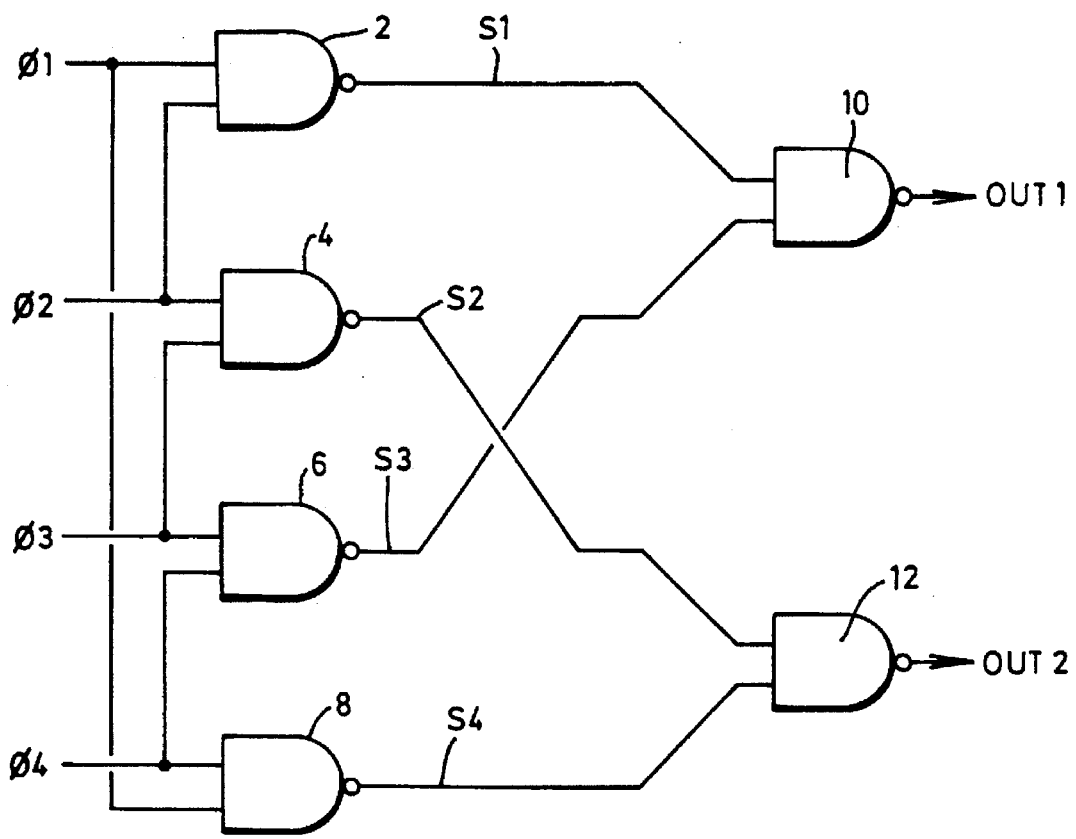
FIG. 1 is a circuit diagram of a first embodiment of a frequency doubler.
Figure 2:
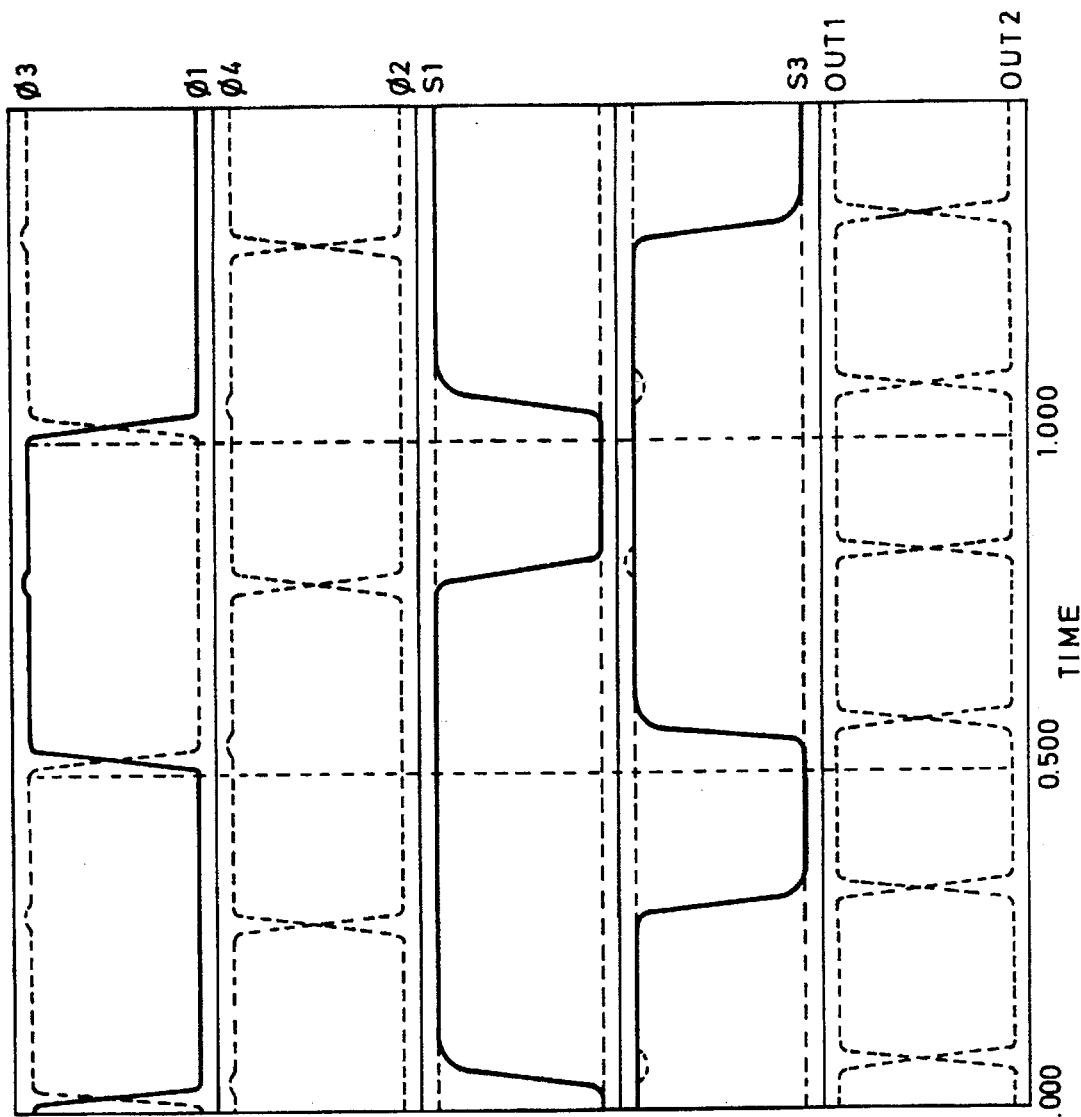
FIG. 2 shows the waveforms of signals in the frequency doubler of FIG. 1.

FIG. 1 shows a frequency doubler connected to receive 4-phase quadrature signals ø1, ø2, ø3, ø4. The input signals ø1 to ø4 can come for example from CMOS-level convertors which are connected to the outputs of a quadrature oscillator. The input signals ø1 to ø4 are fed to a first layer of NAND gates 2,4,6,8. The first NAND gate 2 receives as its inputs ø1, ø2 which are 90° apart. The second NAND gate 4 receives as its inputs the input signals ø2, ø3 which are 90° apart. The third NAND gate 6 receives the input signals ø3, ø4 which are 90° apart. The fourth NAND gate 8 receives input signals ø1, ø4 which are 90° apart. The timing of the input signals is shown in the top two diagrams of FIG. 2 labelled ø1 to ø4 respectively. A second layer of NAND gates comprises fifth and sixth NAND gates 10,12. The fifth NAND gate 10 has as its inputs outputs from the first and third NAND gates 2,6. The sixth NAND gate 12 has as its inputs outputs from the second and fourth NAND gates 4,8. The first layer of NAND gates 2 to 8 combine the inputs ø1 to ø4 to produce four new signals S1 to S4 which go low in turn for 25% of the period. This is shown in the next two diagrams in FIG. 2. The waveforms for S1 and S3 are shown in FIG. 2 but it will be appreciated that S2 and S4 have equivalent waveforms at different parts of the cycle.

The second layer of NAND gates 10, 12 combine the signals S1 to S4 to produce a pair of output signals Out1, Out2 which alternate high and low twice in every period of the input signals. Thus, the output is toggling at twice the frequency of the input. This is shown in the last diagram of FIG. 2.

For minimum distortion of mark/space ratio, the NAND gates 10,12 of the second layer are best implemented as symmetrical designs, that is the delay from input to output is identical for each input.

Figure 3:
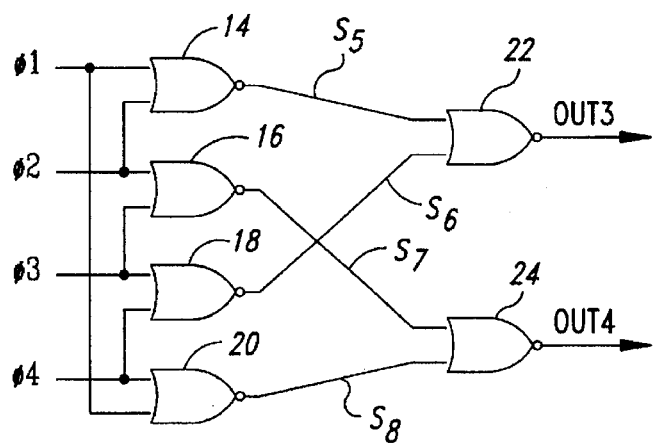
FIG 3 is a circuit diagram of a second embodiment of a frequency doubler.

A feature of this circuit is that no feedback is required between the layers of NAND gates. Thus, the second layer has as its inputs only inputs from the first layer and the first layer has as its inputs only the 4-phase input signals. There is no feedback from the first layer to the input or from the second layer to the first layer. FIG. 3 is a schematic diagram of a second embodiment of a frequency doubler. In this second embodiment, the NAND gates of FIG. 1 are replaced with NOR gates.

In operation, a first set of NOR gates 14, 16, 18, and 20 receive the inputs ø1, ø2, ø3, and ø4, and respectively generate the signals S5, S6, S7, and S8. A second set of NOR gates 22 and 24 respectively receive the signals S5 and S6, and S7 and S8, and generate the output signals Out3 and Out4.

For minimum distortion of mark/space ratio, the NOR gates 22 and 24 of the second stage can be made to have identical or nearly identical delays from their respective inputs to their respective outputs.

Furthermore, like the frequency doubler of FIG. 1, a feature of the frequency doubler of FIG. 3 is that no feedback is required between the two stages of NOR gates.

Figure 4:
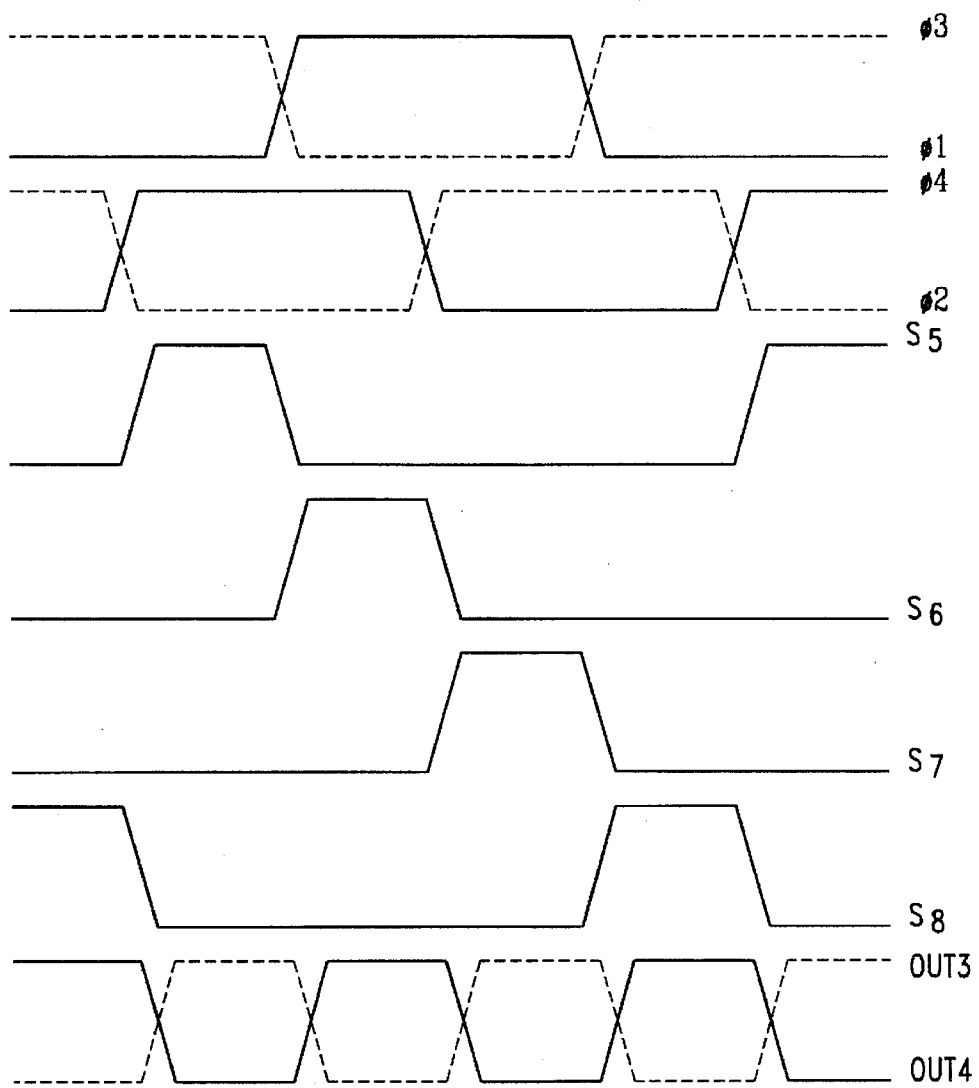
FIG. 4 shows the waveforms of signals in the frequency doubler of FIG. 3.

FIG. 4 is a diagram showing the signals of FIG. 3 and their approximate timing relative to one another. As shown, the output signals Out3 and Out4 oscillate at a frequency that is twice that of the frequency of the input signals ø1–ø4.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A frequency doubler circuit for receiving first to fourth input signals in quadrature and comprising:

a first set of logic gates comprising a first NOR gate connected to receive the first and second input signals and providing an output therefrom and a second NOR gate connected to receive the third and fourth input signals and providing an output therefrom; and a second set of logic gates comprising a third NOR gate connected to receive the outputs of the first and second NOR gates and which supplies an output at twice the frequency of the input signals.

2. A frequency doubler circuit for receiving first to fourth input signals in quadrature and comprising:

a first set of logic gates having inputs for receiving the input signals and providing outputs therefrom wherein the first set of logic gates comprises a first logic gate connected to receive the first and second input signals, a second logic gate connected to receive the second and third input signals, a third logic gate connected to receive the third and fourth input signals and a fourth logic gate connected to receive the first and fourth input signals; and a second set of logic gates which have as their inputs only the outputs from the first set of logic gates and which supply as their outputs two signals in antiphase at twice the frequency of the input signals, wherein the second set of logic gates comprises a fifth logic gate connected to receive the outputs of the first and third logic gates and a sixth logic gate connected to receive the outputs of the second and fourth logic gates.

3. A frequency doubler according to claim 2 wherein the logic gates are NAND gates.

4. The frequency doubler circuit of claim 1 wherein the first set of logic gates further comprises a fourth NOR gate connected to receive the second and third input signals and providing an output therefrom and a fifth NOR gate connected to receive the fourth and first input signals and providing an output therefrom, and wherein the second set of logic gates further comprises a sixth NOR gate connected to receive the outputs of the fourth and fifth NOR gate and which supplies an output at twice the frequency of the input signals.

5. The frequency doubler of claim 4 wherein the outputs of the third and sixth NOR gates are in antiphase.

6. A frequency doubler circuit for receiving first to fourth input signals in quadrature and comprising:

a first set of logic gates having inputs for receiving the input signals and providing outputs therefrom wherein the first set of logic gates comprises a first NAND gate connected to receive the first and second input signals, a second NAND gate connected to receive the second and third input signals, a third NAND gate connected to receive the third and fourth input signals and a fourth NAND gate connected to receive the first and fourth input signals; and a second set of logic gates which have as their inputs only the outputs from the first set of logic gates and which supply as their outputs two signals in antiphase at twice the frequency of the input signals, wherein the second set of logic gates comprises a fifth NAND gate connected to receive the outputs of the first and third NAND gates and a sixth NAND gate connected to receive the outputs of the second and fourth NAND gates.

\* \* \* \* \*